(12) United States Patent
Kleemann

(10) Patent No.: US 7,453,643 B2
(45) Date of Patent: Nov. 18, 2008

(54) BLAZED DIFFRACTIVE OPTICAL ELEMENT AND PROJECTION OBJECTIVE FOR A MICROLITHOGRAPHIC PROJECTION EXPOSURE APPARATUS

(75) Inventor: Bernd Kleemann, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 262 days.

(21) Appl. No.: 11/280,282

(22) Filed: Nov. 17, 2005

(65) Prior Publication Data
US 2006/0193052 A1 Aug. 31, 2006

Related U.S. Application Data

(63) Continuation of application No. PCT/EP2004/004637, filed on May 17, 2003.

(30) Foreign Application Priority Data
May 17, 2003 (DE) .......................... 103 22 238

(51) Int. Cl.
*G02B 5/18* (2006.01)
(52) U.S. Cl. .................. 359/571; 359/569; 359/566
(58) Field of Classification Search ................. 359/569, 359/571, 566
See application file for complete search history.

(56) References Cited

U.S. PATENT DOCUMENTS

| | | | |
|---|---|---|---|
| 5,122,903 A | 6/1992 | Aoyama et al. | |
| 6,122,104 A | 9/2000 | Nakai | |
| 6,678,037 B2 * | 1/2004 | Van Elp et al. | 355/67 |
| 7,075,722 B2 * | 7/2006 | Nakai | 359/571 |
| 2002/0003661 A1 | 1/2002 | Nakai | |
| 2002/0034011 A1 | 3/2002 | Nakai | |
| 2003/0016448 A1 | 1/2003 | Takasuka et al. | |

FOREIGN PATENT DOCUMENTS

| | | |
|---|---|---|
| EP | 0 898 182 A2 | 2/1999 |
| EP | 0 902 304 A2 | 3/1999 |
| EP | 0 965 864 A2 | 12/1999 |
| EP | 1 022 589 A1 | 7/2000 |
| EP | 1 072 906 A2 | 1/2001 |
| EP | 1 148 355 A1 | 10/2001 |

(Continued)

OTHER PUBLICATIONS

Mane-Si Laure Lee, Philippe Lalanne, Pierre Chavel, Edmond Cambril, Imaging with Blazed-Binary Diffractive Elements, Physics, Theory, and Applications of Periodic Structures in Optics, 2001, pp. 62-68, Proceedings of SPIE vol. 4438, Orsay Cedex, France and Bagneux, France.

(Continued)

*Primary Examiner*—Audrey Y Chang
(74) *Attorney, Agent, or Firm*—Sughrue Mion, PLLC

(57) ABSTRACT

A diffractive optical element has a support and a plurality of diffraction structures. The latter are applied on the support and are binary blazed by being split into substructures so that the aspect ratio of the substructures varies locally within an individual diffraction structure. One or more substructures with a large aspect ratio inside an individual diffraction structure are replaced by at least one substitute structure whose aspect ratio is less than that of the replaced substructures.

8 Claims, 2 Drawing Sheets

FOREIGN PATENT DOCUMENTS

| | | |
|---|---|---|
| EP | 1 160 589 A1 | 12/2001 |
| JP | 01282501 A | 11/1989 |
| JP | 2001108812 A | 4/2001 |

OTHER PUBLICATIONS

Mane-Si Laure Lee, Philippe Lalanne, Pierre Chavel, Blazed-Binary Diffractive Elements with Periods Much Larger Than the Wavelength, Optical Society of America, Jul. 2000, pp. 1250-1255, vol. 17, No. 7, Orsay Cedex, France.

Mane-Si Laure Lee, Philippe Lalanne, Jean-Claude Rodier, Edmond Cambril, Wide-Field-Angle Behavior of Blazed-Binary Gratings in the Resonance Domain, Optical Society of America, Dec. 1, 2000, pp. 1690-1692, vol. 25, No. 23, Orsay Cedex, France and Bagneux, France.

Philippe Lalanne, Waveguiding in Blazed-Binary Diffractive Elements, Optical Society of America, Oct. 1999, pp. 2517-2520, vol. 16, No. 10, Orsay Cedex, France.

Philippe Lalanne, Simion Astilean, Pierre Chavel, Edmond Camrbril, Huguette Launois, Design and Fabrication of Blazed Binary Diffractive Elements With Sampling Periods Smaller Than the Structural Cutoff, Optical Society of America, May 1999, pp. 1143-1156, vol. 16, No. 5, Orsay Cedex, France and Bagneux, France.

Philippe Lalanne, Simion Astilean, Pierre Chavel, Edmond Cambril, Huguette Launois, Blazed Binary Subwavelength Gratings With Efficiencies Larger Than Those of Conventional Echelette Gratings, Optical Society of America, Jul. 15, 1998, pp. 1081-1083, Optics Letters vol. 23, No. 14, Orsay Cedex, France and Bagneux, France.

Simion Astilean, Philippe Lalanne, Pierre Chavel, Edmond Cambril, Huguette Launois, High-Efficiency Subwavelength Diffractive Element Patterned in a High-Refractive-Index Material for 633 NM, Optical Society of America, Apr. 1, 1998, pp. 552-554, Optics Letters vol. 23, No. 7, Orsay Cedex, France and Bagneux, France.

Dennis Prather, Design and Application of Subwavelength Diffractive Lenses for Integration With Infrared Photodetectors, Society of Photo-Optical Instrumentation Engineers, May 1999, pp. 870-878, Optical Engineering vol. 38, No. 5, Newark, Delaware.

M.E. Warren, R.E. Smith, G.A. Vawter, J.R. Wendt, High-Efficiey Subwavelength Diffractive Optical Element in GAAS for 975 NM, Optical Society of America, Jun. 15, 1995, pp. 1441-1443, Optics Letters vol. 20, No. 12, New York, NY.

Michael Wang, Heng Su, Multilevel Diffractive Microlens Fabrication by One-Step Laser-Assisted Chemical Etching Upon High-Energy Beam Sensitive Glass, Optical Society of America, Jun. 1, 1998, pp. 876-878, Optics Letters vol. 23, No. 11, Coral Gables, Florida.

Zhiping Zhou, Timothy Drabik, Optimized Binary, Phase-Only, Diffractive Optical Element With SubWavelength Features for 1.55 UM, May 1995, pp. 1104-1112, Journal Optical Soc. Am. vol. 12, No. 5, Atlanta, GA.

* cited by examiner

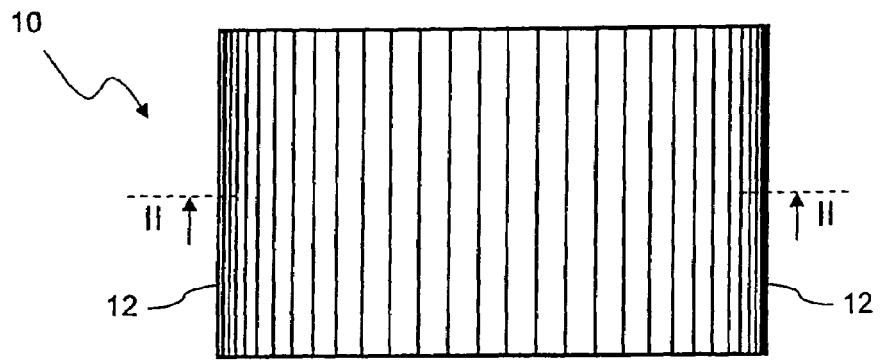
Fig. 1
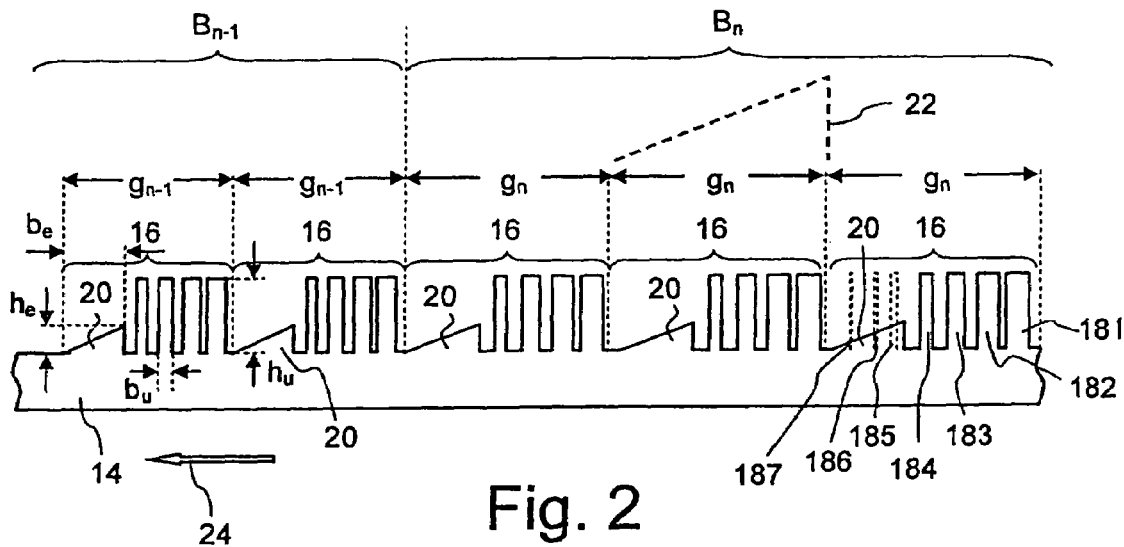
Fig. 2
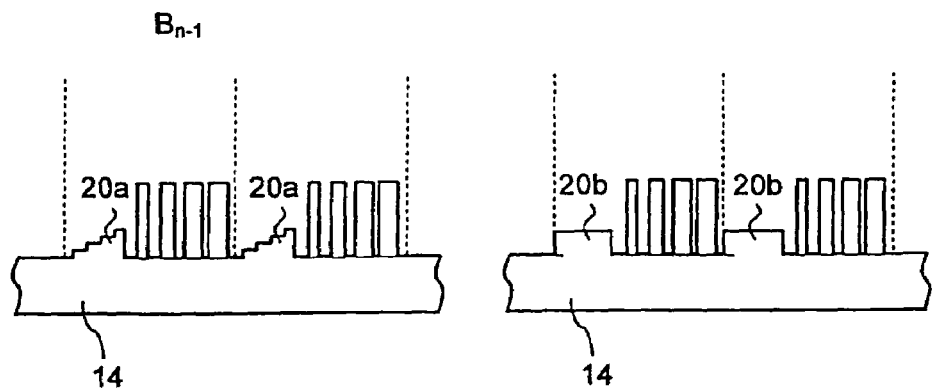
Fig. 3
Fig. 4

BLAZED DIFFRACTIVE OPTICAL ELEMENT AND PROJECTION OBJECTIVE FOR A MICROLITHOGRAPHIC PROJECTION EXPOSURE APPARATUS

CROSS-REFERENCE TO RELATED APPLICATIONS

This application is a continuation of International Application PCT/EP2004/004637, with an international filing date of May 3, 2004 and claiming priority of German Patent Application DE 103 22 238 filed May 17, 2003. The full disclosures of both earlier applications are incorporated herein by reference.

BACKGROUND OF THE INVENTION

1. Field of the Invention

The invention relates to a diffractive optical element having a support and a plurality of diffraction structures which are applied thereon and are binary blazed by being split into substructures so that the aspect ratio of the substructures varies locally within an individual diffraction structure.

2. Description of Related Art

Diffractive optical elements with locally varying grating constants have found many applications in optics. Diffractive optical elements are used, for example, to generate wavefront profiles which cannot—or only with great difficulty—be achieved by refractive optical elements such as lenses. Fresnel lenses which make it possible to achieve extremely short focal lengths are also widely used. The use of diffractive optical elements to correct chromatic aberrations in optical systems, which are caused by the dispersive properties of the conventional lens materials with broadband light sources, has been proposed, for example, in EP 0 965 864 A2. It is also feasible to use diffractive optical elements for focusing, collimation and beam splitting of laser light in integrated optics, since diffractive optical elements can likewise be produced photolithographically.

Diffractive optical elements whose diffraction structures are blazed, i.e. having a ramp-shaped profile or a profile approximating a ramp shape, are particularly widespread. In comparison with diffractive optical elements whose diffraction structures have a rectangular profile, higher diffraction efficiencies for a desired diffraction order can be achieved by such blazed diffraction structures. The diffraction efficiency of a diffractive optical element means the fraction of the light incident on the diffractive optical element which contributes to a particular diffraction order.

An article by P. Lalanne et al. entitled "*Design and fabrication of blazed binary diffractive elements with sampling periods smaller than the structural cutoff*", J. Opt. Soc. Am. A, Vol. 16, No 5, pages 1143 to 1156, discloses diffractive optical elements having diffraction structures which are blazed by splitting them into substructures. The substructures are designed as bars or pillars whose characteristic dimensions are smaller than the wavelength for which the diffractive optical element is intended. Beyond the zeroth order, the substructures then generate no further diffraction orders which could take up energy. Diffraction efficiencies of 80% or more are therefore possible. Via the dimensions of the substructures and their mutual spacing, a refractive index profile which approximates that of a conventional blazed diffraction structure can be generated on the surface.

If the spacings of the pillars or bars are less than a so-called structure period, then the diffractive substructures can be regarded as homogeneous medium in which only one mode can propagate. Even higher diffraction efficiencies are possible in this case. The value of the structure period depends inter alia on the angle of incidence of the light and the geometry of the substructures.

Besides the high diffraction efficiencies, binary substructures furthermore have the advantage of a large angle acceptance. This means that the high diffraction efficiencies can be achieved even with significant deviations from the ideal blaze angle. Furthermore, the high diffraction efficiencies are achieved with a lower polarization dependency and in a larger wavelength range than with conventional blaze structures.

A disadvantage with diffractive optical elements having blazed diffraction structures, however, is that the bar-shaped or pillar-shaped substructures have to be extremely narrow in the regions inside a diffraction structure where the effective refractive index is intended to be particularly small. This leads to very high aspect ratios. This term denotes the ratio of structure height to structure width of the substructures. Structures having such high aspect ratios entail significant problems in production technology, since it is not possible to generate arbitrarily narrow structures by the conventional production method based on deep etching. For production reasons, therefore, the narrowest substructures have previously been avoided, as is described in the aforementioned article by P. Lalanne et al. Avoiding the smallest substructures, however, reduces the maximum achievable efficiency of the diffractive optical element.

SUMMARY OF THE INVENTION

It is therefore an object of the present invention to provide a diffractive optical element which is simple to produce and has a very high diffraction efficiency.

This object is achieved by a diffractive optical element that has a support and a plurality of diffraction structures. The diffraction structure are applied on the support and are binary blazed by being split into substructures so that the aspect ratio of the substructures varies locally within an individual diffraction structure. One or more substructures with a large aspect ratio inside an individual diffraction structure are replaced by at least one substitute structure whose aspect ratio is less than that of the replaced substructures.

It has been found that when suitable substitute structures are selected, their effect on the phase of incident light corresponds at least approximately to the effect of the replaced substructures. Although it is not possible to achieve quite such high diffraction efficiencies as with complete substructures, i.e. ones obtained per se computationally, the achievable diffraction efficiency is nevertheless significantly higher than when the substructures with a high aspect ratio are entirely omitted because of the production difficulties.

The aspect ratio of the substitute structure may be less than that of the replaced substructures because it has a lower height and/or a larger width than each of the replaced substructures.

It is preferable for the at least one substitute structure to have an at least approximately ramp-shaped profile. In this way, inside binary blazed diffraction structures which are conceived as a substitute for conventional diffraction structures, individual substructures are in turn replaced the other way round by a structure with a conventional blaze shape.

It is then naturally advantageous for the at least one substitute structure to have a conventional blaze profile with a continuously rising blaze edge and a back edge falling steeply, in particular perpendicularly to the base surface.

It is however easier to produce substitute structures having a blaze profile which, using a step curve, approximates a conventional blaze profile with a continuously rising blaze edge and a back edge falling steeply, in particular perpendicularly to the base surface. The diffraction efficiency is in this case commensurately greater as the step curve approximates the ramp shape better. The substitute structure then has a rectangular profile and may thus also be regarded as a binary substructure which is normal per se, but which is flatter and/or wider than each of the substrates which are replaced by the substitute structure.

BRIEF DESCRIPTION OF THE DRAWINGS

Various features and advantages of the present invention may be more readily understood with reference to the following detailed description taken in conjunction with the accompanying drawings, in which FIG. 1 shows a schematic representation in plan view, not true to scale, of a rectangular diffractive optical element designed as a linear grating;

FIG. 2 shows an enlarged detail of a section along the line II-II through the diffractive optical element shown in FIG. 1;

FIG. 3 shows a representation, corresponding to FIG. 2, of another diffractive optical element having substitute structures whose profile is step-wise approximated to a blaze profile;

FIG. 4 shows a representation, corresponding to FIG. 2, of another diffractive optical element in which the substitute structures have a rectangular profile;

DETAILED DESCRIPTION OF THE INVENTION

Figure 5:
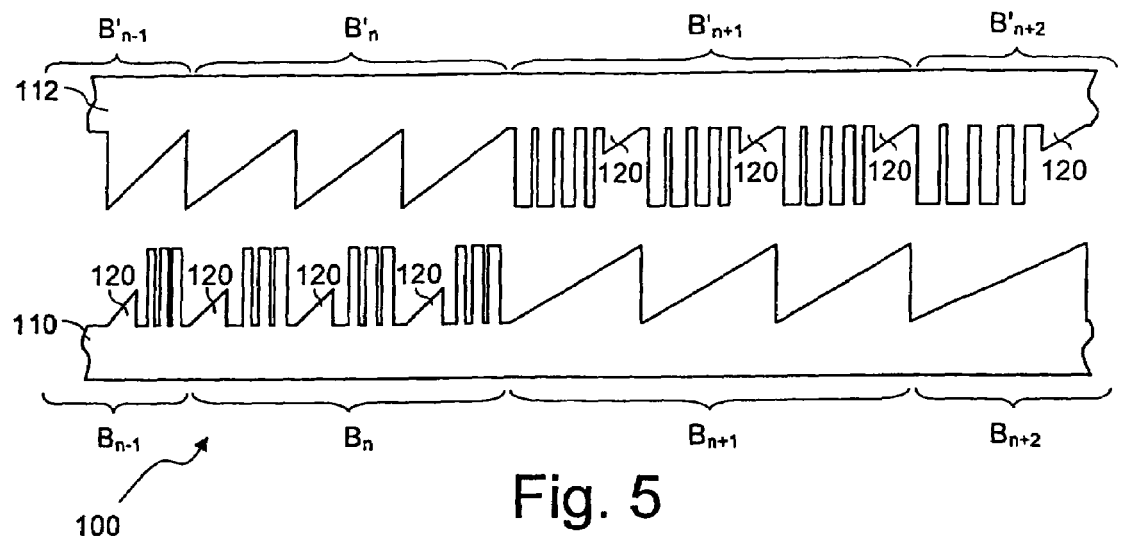
FIG. 5 shows a detail of a section through a diffractive optical element comprising two sub-elements arranged above one another, which are respectively constructed similarly as the diffractive optical element shown in FIGS. 1 and 2.

A first exemplary embodiment of a diffractive optical element, denoted overall by 10, is shown in FIG. 1 by a schematic representation in plan view, which is not true to scale, and in FIG. 2 as details in a section along the line II-II. The diffractive optical element 10 is designed as a rectangular linear blaze grating, the grating constant g of which decreases sectionally towards the transverse sides 12. FIG. 1 indicates the decrease in the grating constant by the vertical lines which become denser towards the transverse sides 12.

The diffractive optical element 10 comprises a multiplicity of diffraction structures 16 applied on a support 14, which are subdivided into a plurality of regions with respectively equal grating constants. The enlarged sectional representation of FIG. 2 represents in all two of these regions $B_{n-1}$ and $B_n$, within which the grating constant $g_i$ is respectively constant. The grating constants $g_i$ decrease from right to left in the representation of FIG. 2, i.e. $g_n > g_{n-1}$.

The diffraction structures 16 are respectively binary blazed. This means that each binary blazed diffraction structure 16 consists of a group of bar-shaped substructures 181, 182, 183, 184 and a substitute structure 20 which is yet to be explained. Each binary diffraction structure 16 can be thought of as a substitute for a conventional ramp-shaped diffraction structure, as indicated in FIG. 2 for one of the diffraction structures 16 by a ramp profile 22 represented as dashes.

Within a binary blazed diffraction structure 16, the width b of the bar-shaped substructures 181, 182, 183, 184 respectively decreases in a direction indicated by 24, and the distance between the substructures 181, 182, 183, 184 increases in this direction 24, so that each group of substructures 181, 182, 183, 184 and 20 forming a diffraction structure 16 optically has essentially the same diffraction effect on incident light as a corresponding ramp-shaped diffraction structure 22 with an equal grating constant $g_i$. In contrast to such ramp-shaped diffraction structures 22, however, the binary blazed diffraction structures 16 have a higher diffraction efficiency which furthermore depends less strongly on the angle of incidence of the light, its polarization and its wavelength. A prerequisite here is merely that the substructures 181, 182, 183, 184 and 20 have characteristic dimensions which are smaller than the wavelength of the incident light.

Inside each binary blazed diffraction structure 16, the substitute structure 20 respectively replaces a group of substructures 185, 186, 187, which are indicated as dashes on the right in FIG. 2. The aspect ratio in these substructures 185, 186, 187, i.e. the ratio between structure height $h_u$ and structure width $b_u$ (see the left in FIG. 2), is so great that they cannot be produced, or can be produced only with very great difficulty. The diffraction structures 20, however, have a substantially smaller aspect ratio since they have both a lower height $h_e$ and a larger width $b_e$ than the substructures 185, 186, 187 whose effect they at least partially replace. Owing to this more favorable aspect ratio, the substitute structures 20 can be produced without great difficulties at least for grating constants $g_i$ which are not too small.

In the exemplary embodiment shown in FIG. 2, the substitute structures 20 have a ramp-shaped profile by which they can replicate the optical effect of the replaced substructures 185, 186, 187 particularly well. If the production of these ramp-shaped profiles with very small constants $g_i$ is too difficult for the intended application, then the ramp shape of the substitute structures may also be approximated by a step curve, as shown for substitute structures 20a in FIG. 3. Production of the substitute structures is even simpler when they merely have a rectangular profile, as shown for substitute structures 20b in FIG. 4.

FIG. 5 shows another exemplary embodiment of a diffractive optical element, denoted overall by 100, as details in a sectional representation. The diffractive optical element 100 comprises a first sub-element 110 and a second sub-element 112, which are arranged above one another and mutually parallel. The regions $B_n$ and $B_{n-1}$ of the sub-element 110 are constructed as shown for the diffractive optical element 10 in FIG. 2. The subsequent regions $B_{n+1}$ and $B_{n+2}$ have a larger grating constant and are conventionally blazed, i.e. the diffraction structures have the typical ramp shape in profile.

The second sub-element 112 is constructed similarly as the first sub-element 110 but, unlike it, the regions $B'_n$ and $B'_{n-1}$ with small grating constants are blazed in the conventional way instead of the regions $B'_{n+1}$ and $B'_{n+2}$ with large grating constants. In both sub-elements 110 and 112, the substitute structures 120 provided in the binary blazed diffraction structures respectively have a ramp-shaped profile as already shown in FIG. 2.

Instead of the flat support, it is also possible to use curved supports, for example lens surfaces. The two sub-elements 110 and 112 may furthermore consist of different materials, or have supports which consist of a different material than the diffraction structures. Furthermore, unlike the exemplary embodiment shown in FIG. 5, the two sub-elements 110 and 112 also differ by the profile depth. Diffractive optical elements with sub-elements which are arranged above one another, but are only conventionally blazed, are known per se from EP 0 965 864 A2.

Figure 6:
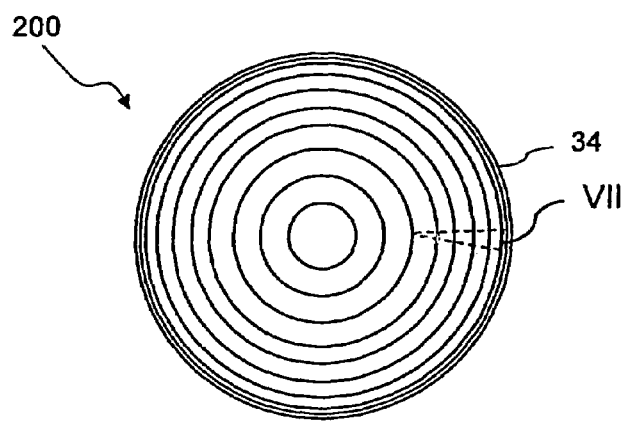
FIG. 6 shows a schematic representation in plan view, not true to scale, of a diffractive optical element designed as a Fresnel lens.

In a schematic representation which is not true to scale, FIG. 6 shows another exemplary embodiment, denoted by 200, of a diffractive optical element in plan view. The diffractive optical element 200 is a Fresnel lens, in which the grating constant g decreases with increasing distance from the middle of the element 200. This is indicated in FIG. 6 by the circle lines becoming denser outwards. The Fresnel lens 200 may, for example, be intended for installation in a projection objective of a microlithographic projection exposure apparatus.

Figure 7:
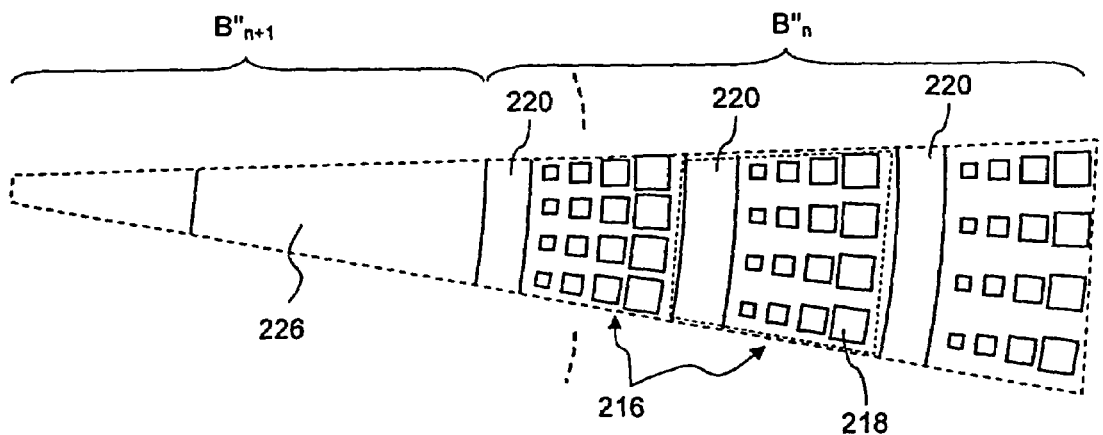
FIG. 7 shows an enlarged detail VII of the Fresnel lens in FIG. 6.

The detail VII of the plan view in FIG. 6 is represented on an enlarged scale in FIG. 7. It shows a region $B''_n$, lying close to the circumference 34, where the diffraction structures 216 are binary blazed. Here, the substructures 218 are designed not as bars but as pillars with a square base surface. In this case, the pillars with the smallest ratio between the height and base surface are replaced by annular substitute structures 220 which have in profile the ramp shape shown in FIG. 2. In the neighboring region $B''_{n+1}$ towards the middle of the element 200, the diffraction structures 226 again have the conventional ramp shape.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A diffractive optical element, comprising:
   a support and
   a plurality of diffraction structures which
   are applied on the support and
   are binary blazed by being split into substructures so that the aspect ratio of the substructures varies locally within an individual diffraction structure,
   wherein one or more substructures inside an individual diffraction structure are replaced by at least one substitute structure whose aspect ratio is less than that of the replaced substructures.

2. The optical element of claim 1, wherein the at least one substitute structure has an at least approximately ramp-shaped profile.

3. The optical element of claim 2, wherein the at least one substitute structure has a blaze profile with a continuously rising blaze edge and a back edge falling steeply.

4. The optical element of claim 3, wherein the back edge forms a right angle with the base surface.

5. The optical element of claim 2, wherein the at least one substitute structure has a blaze profile which, using a step curve, approximates a blaze profile with a continuously rising blaze edge and a back edge falling steeply.

6. The optical element of claim 5, wherein the back edge forms a right angle with the base surface.

7. The optical element of claim 1, wherein the at least one substitute structure has a rectangular profile.

8. A projection objective for a microlithographic projection exposure apparatus, comprising the diffractive optical element of claim 1.

* * * * *